United States Patent
Kim

(10) Patent No.: US 9,674,955 B2
(45) Date of Patent: Jun. 6, 2017

(54) TAPE CARRIER PACKAGE, METHOD OF MANUFACTURING THE SAME AND CHIP PACKAGE

(71) Applicant: LG INNOTEK CO., LTD., Seoul (KR)

(72) Inventor: Hong Il Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 60 days.

(21) Appl. No.: 14/357,450

(22) PCT Filed: Nov. 6, 2012

(86) PCT No.: PCT/KR2012/009284
§ 371 (c)(1),
(2) Date: May 9, 2014

(87) PCT Pub. No.: WO2013/069947
PCT Pub. Date: May 16, 2013

(65) Prior Publication Data
US 2014/0313683 A1    Oct. 23, 2014

(30) Foreign Application Priority Data

Nov. 9, 2011  (KR) .......................... 10-2011-0116289
Nov. 29, 2011  (KR) .......................... 10-2011-0125656

(51) Int. Cl.
*H05K 3/46* (2006.01)
*H05K 1/11* (2006.01)
(Continued)

(52) U.S. Cl.
CPC ............ *H05K 1/115* (2013.01); *H01L 21/486* (2013.01); *H01L 23/4985* (2013.01);
(Continued)

(58) Field of Classification Search
CPC ................... H05K 3/4635; H05K 2201/10681
See application file for complete search history.

(56) References Cited

U.S. PATENT DOCUMENTS 5,656,550 A *  8/1997  Tsuji .................... H01L 21/565
                                                    257/786
6,192,579 B1 *  2/2001  Hayashi ............ H01L 23/49816
                                                    174/262
(Continued)

FOREIGN PATENT DOCUMENTS

JP         05235108 A  *  9/1993
JP         08008304 A  *  1/1996
(Continued)

OTHER PUBLICATIONS

International Search Report in International Application No. PCT/KR2012/009284, filed Nov. 6, 2012, Mailed Apr. 19, 2013.
(Continued)

*Primary Examiner* — Nathan Milakovich
(74) *Attorney, Agent, or Firm* — Saliwanchik, Lloyd & Eisenschenk

(57) ABSTRACT

Provided are a tape carrier package and a method of manufacturing the same, the method, including: forming through holes by performing a drill process using a laser to an insulating film of a flexible copper clad laminate (FCCL) film consisting of the insulating film and a copper layer; forming a circuit pattern layer by performing an etching process to the copper layer of the FCCL film; and selectively forming a plating layer on the circuit pattern layer. The method of manufacturing the tape carrier package according to the present invention is advantageous because a punching process, and processes for laminating and drying the copper layer which are necessary for the conventional method of manufacturing the tape carrier package can be omitted, a production cost of the tape carrier package is reduced, and the time required for the drying process is saved.

4 Claims, 4 Drawing Sheets

(51) Int. Cl.
  *H01L 21/48* (2006.01)
  *H05K 3/00* (2006.01)
  *H01L 23/498* (2006.01)
  *H05K 1/18* (2006.01)
  *H05K 1/03* (2006.01)

(52) U.S. Cl.
  CPC ........... *H05K 1/181* (2013.01); *H05K 3/0038* (2013.01); *H01L 2924/0002* (2013.01); *H05K 1/0393* (2013.01); *H05K 2201/09009* (2013.01)

(56) References Cited

U.S. PATENT DOCUMENTS

| | | | | |
|---|---|---|---|---|
| 6,563,057 | B2 * | 5/2003 | Hotta | H05K 3/422 174/261 |
| 6,969,557 | B2 * | 11/2005 | Matsuda | C25D 5/16 428/546 |
| 9,060,431 | B2 * | 6/2015 | Arai | C25D 7/0614 |
| 2001/0007373 | A1 * | 7/2001 | Kadota | H01L 23/4985 257/730 |
| 2010/0244281 | A1 * | 9/2010 | Hayashi | H01L 23/49572 257/784 |
| 2011/0204497 | A1 * | 8/2011 | Matsuda | H01L 21/563 257/669 |
| 2012/0002420 | A1 * | 1/2012 | Imai | H01L 33/486 362/249.02 |
| 2012/0043114 | A1 * | 2/2012 | Cho | H01L 23/4985 174/251 |
| 2014/0268619 | A1 * | 9/2014 | Kang | H01L 24/48 361/783 |
| 2014/0329036 | A1 * | 11/2014 | Suh | H05K 13/0084 428/35.2 |
| 2015/0054162 | A1 * | 2/2015 | Kim | H01L 24/29 257/766 |

FOREIGN PATENT DOCUMENTS

| | | | | |
|---|---|---|---|---|
| JP | H10-303254 | A | | 11/1998 |
| JP | 2000260830 | A * | 9/2000 | |
| JP | 3392992 | B2 * | 3/2003 | ............ H01L 24/97 |
| JP | 2004103706 | A * | 4/2004 | |
| JP | 2006049642 | A * | 2/2006 | |
| JP | 4069588 | B2 * | 4/2008 | |
| JP | 2009-016716 | A | | 1/2009 |
| KR | 1020080043222 | A | | 5/2008 |
| KR | 10-2010-0032151 | A | | 3/2010 |
| KR | 10-0951939 | B1 | | 4/2010 |
| KR | 10-2010-0053964 | A | | 5/2010 |
| TW | 2011-03106 | A | | 1/2011 |

OTHER PUBLICATIONS

International Search Report in International Application No. PCT/KR2012/009284, filed Nov. 6, 2012.

* cited by examiner

TAPE CARRIER PACKAGE, METHOD OF MANUFACTURING THE SAME AND CHIP PACKAGE

CROSS-REFERENCE TO RELATED APPLICATIONS

This application is the U.S. national stage application of International Patent Application No. PCT/KR2012/009284, filed Nov. 6, 2012, which claims priority to Korean Application Nos. 10-2011-0116289, filed Nov. 9, 2011, and 10-2011-0125656, filed Nov. 29, 2011, the disclosures of each of which are incorporated herein by reference in their entirety.

TECHNICAL FIELD

Embodiments of the present invention relate to a tape carrier package, a method of manufacturing the same and a chip package.

BACKGROUND ART

A tape carrier package (TCP) is a semiconductor package manufactured by bonding an Au bump of an LCD driver IC (LDI) and an inner lead of a carrier tape with a thereto compression bonding method using a tape automated bonding (TAB) technology and applying resin thereto.

The carrier tape is configured such that a copper foil is bonded to a polyimide film using an adhesive, a circuit is formed in the copper foil through a process of various steps for manufacturing the tape, and a copper pattern is plated with Sn. The bonding of the LCD driver IC (LDI) and the tape is made by an Au—Sn eutectic reaction. This is called an inner lead bonding (ILB) process. The tape carrier package is bonded to an LCD panel and a printed circuit board (or FPC) through an outer lead bonding (OLB) process. For the outer lead bonding, an anisotropic conductive film (ACF) is mainly used.

FIG. 1 is a view showing a process of manufacturing a conventional tape carrier package.

Referring to FIG. 1, an insulating layer 10 is prepared (S1), and an adhesive (not drawn) is applied to one surface of the insulating layer. The insulating layer 10 is formed of polyimide. Next, through holes are formed by performing a punching process to the insulating layer 10 (S2).

Then, a metal layer 20 is formed on a surface to which the adhesive of the insulating layer 10 is applied. The metal layer 20 is formed by laminating Cu on the surface to which the adhesive of the insulating layer is applied. In this case, the metal layer 20 is dried for 6 to 24 hours at 160° C. to improve adhesion with the adhesive.

After activating a surface by performing various chemical treatments to the metal layer 20, a photo resist is applied to the surface, and an exposure process and a development process are carried out. After the development process is completed, necessary circuits are formed through an etching process, and a circuit pattern layer 22 is formed by peeling off the photo resist (S4). After the circuit pattern layer 22 is formed, to selectively plate the circuit pattern layer 22, a solder-resist layer 60 is formed by being printed using a solder-resist (S6). Next, a plating layer 70 is formed on the circuit pattern layer 22. At this time, the plating layer 70 is formed at a part except for an area which is masked by the solder-resist layer 60 on the circuit pattern layer 22.

In the process of manufacturing the tape carrier package, a mold is required for the punching process. Thus, when developing a product, due to CNC punching, the delay in development and equipment load are generated. Furthermore, it is to be costly to apply the adhesive in a semi-hardened state to the insulating layer 10. Also, after forming the metal layer on the adhesive applied to the insulating layer 10, it should be dried, and it takes maximum 24 hours to dry it. Thus, this became a factor that increases the production cost and time of the tape carrier package.

DISCLOSURE OF INVENTION

Technical Problem

Accordingly, the present invention has been made keeping in mind the above problems occurring in the related art. An aspect of the present invention provides a tape carrier package, a method of manufacturing the same, and a chip package, which can be manufactured with a smaller cost and time than those required for production according to conventional arts.

Solution to Problem

According to an aspect of embodiments of the present invention, there is provided a tape carrier package including: a base element having an adhesive layer on which a surface roughness is formed; and a circuit pattern layer formed in a lower part of the base element.

According to another aspect of the present invention, there is provided a chip package including: a base element having an adhesive layer on which a surface roughness is formed; a circuit pattern layer formed in a lower part of the base element; a chip disposed on the base element; and a molding portion formed on the chip.

Advantageous Effects of Invention

According to some embodiments of the present invention, a tape carrier package, a method of manufacturing the same, and a chip package are advantageous in that the punching process, and the processes of laminating and drying the copper layer which are necessary for the conventional method of manufacturing the tape carrier package can be omitted, and accordingly, a production cost of the tape carrier package can be reduced and the time required for the drying process can be saved.

Also, according to some embodiments of the present invention, since a surface roughness is formed on the adhesive layer of the base element, adhesive strength with the molding portion is improved, thereby enabling a chip package with excellent reliability and durability to be provided.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

MODE FOR THE INVENTION

Figure 1:
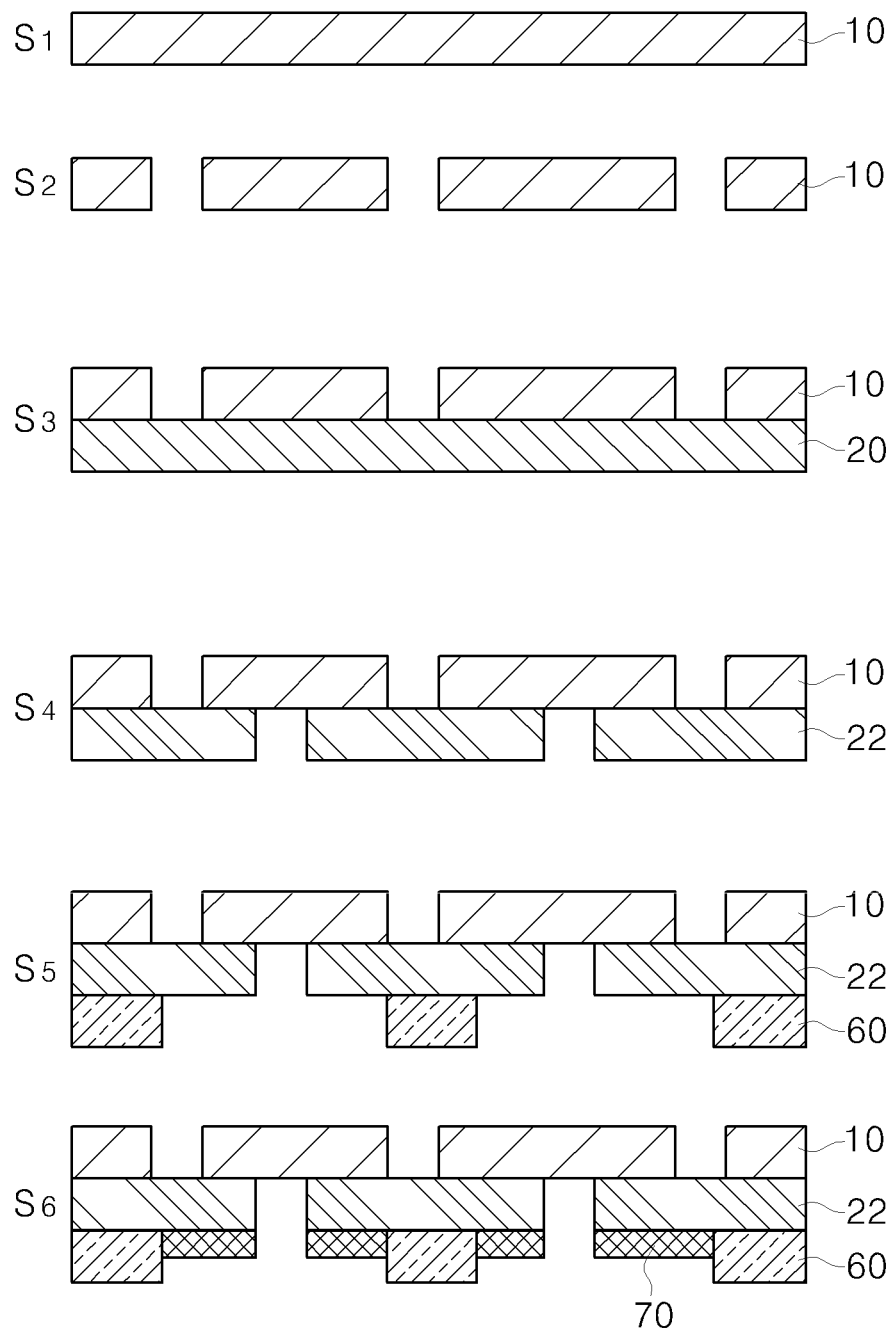
FIG. 1 is a view showing a conventional process for manufacturing a tape carrier package.

Hereinafter, preferred embodiments of the present invention will be described in detail with reference to the accompanying drawings. In the following description, it is to be noted that, when the functions of conventional elements and the detailed description of elements related with the present invention may make the gist of the present invention unclear, a detailed description of those elements will be omitted.

Furthermore, it should be understood that the shape and size of the elements shown in the drawings may be exaggeratedly drawn to provide an easily understood description of the structure of the present invention rather than reflecting the actual sizes of the corresponding elements.

Figure 2:
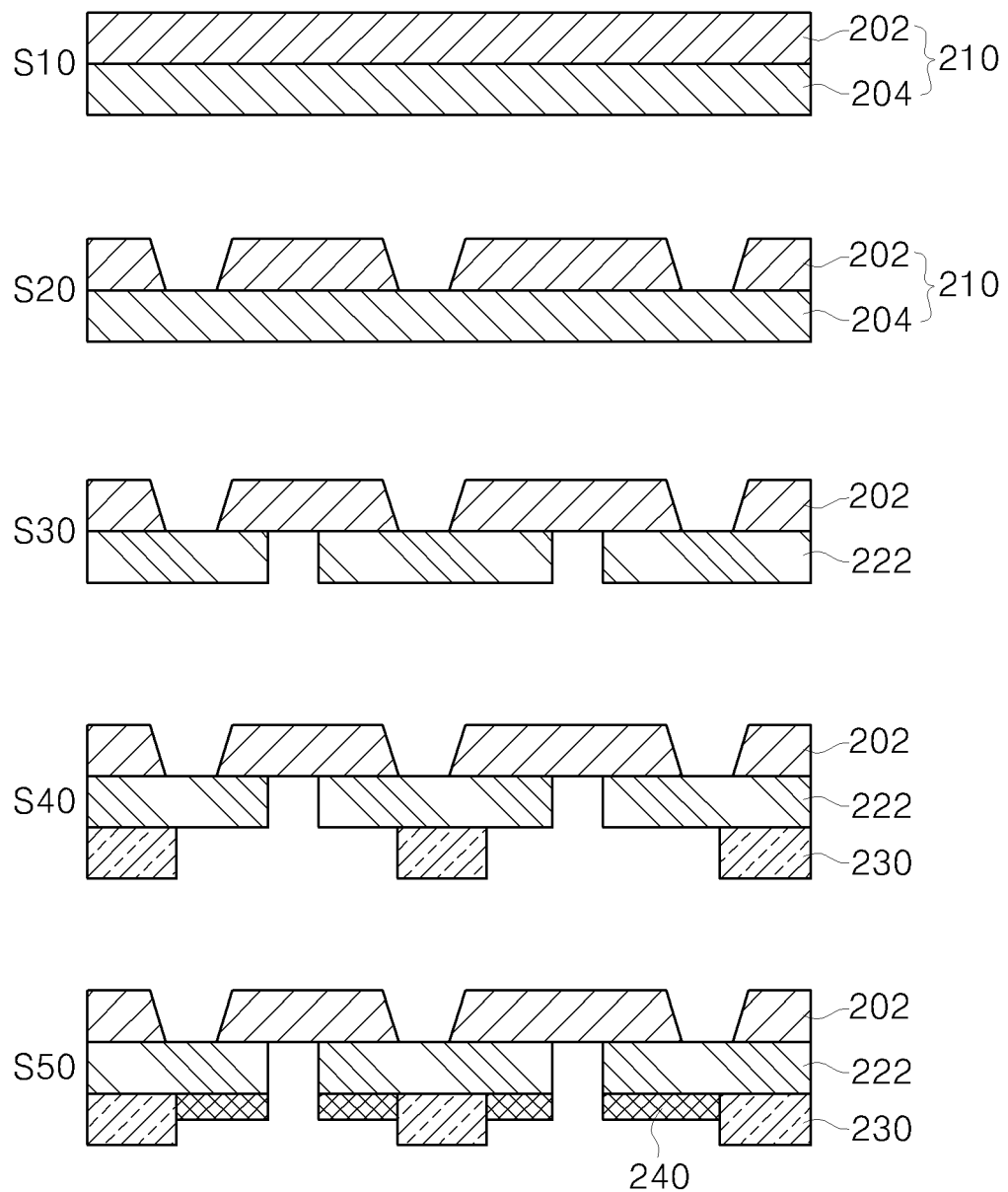
FIG. 2 is a view showing a process of manufacturing a tape carrier package according to a preferred exemplary embodiment of the present invention.

FIG. 2 is a view showing a process of manufacturing a tape carrier package according to a preferred exemplary embodiment of the present invention.

Referring to FIG. 2, a flexible copper clad laminate (hereinafter referred to as the "FCCL") film 210 is prepared (S10). The FCCL film is configured such that a copper layer 204 is laminated on a surface of a polyimide-based film 202. The FCCL film may be used to manufacture a flexible printed circuit board (FPCB) used in a cellular phone, an LCD/PDP, a digital camera, a laptop computer. When manufacturing the FCCL film, as a method of bonding the copper layer to a surface of the polyimide-based film, namely, an insulating film, there are a method of bonding the copper layer 204 to the surface of the polyimide-based film 202 using an adhesive, and a method of laminating the copper layer 204 on the polyimide-based film 202 by electroplating the surface of the polyimide-based film 202 having a copper film with Cu. The FCCL has been manufactured by many companies. Thus, it would be possible to buy it in the relevant market.

Next, a plurality of through holes are formed by performing a drill process using a laser to the insulating film 202 of the FCCL 210 film (S20). In this case, it would be preferable that the laser is an UV laser. The laser drill process means a process of removing a selected part of the insulating film 202 using the laser.

When performing the drill process to the insulating film 202 of the FCCL film 210 using the UV laser, as illustrated in FIG. 2, the formed through holes are formed so that an upper width thereof is wider than a lower width thereof.

Next, after activating a surface through many chemical treatments to the copper layer 202 of the FCCL film 210, a photo resist is applied thereto, and an exposure process and a development process are performed. After the development process is completed, necessary circuits are formed through the etching process, and a circuit pattern layer 222 is formed by peeling off the photo resist (S30). After the circuit pattern layer 222 is formed, to selectively plate the circuit pattern layer 222, a solder-resist layer 230 is formed by being printed using a solder-resist (S40). Next, a plating layer 240 is formed on the circuit pattern layer 222. At this time, the plating layer 240 is formed at a part except for an area which is masked by the solder-resist layer 230 on the circuit pattern layer 221.

Like this, the method of manufacturing the tape carrier package according to the present invention is advantageous because the punching process, the processes of laminating and drying the copper layer which are necessary in the existing method of manufacturing the tape carrier package may be omitted, a production cost of the tape carrier package is reduced, and the time required for the drying process is saved.

Meanwhile, in another exemplary embodiment of the present invention, the tape carrier package is manufactured by etching the copper layer of the flexible cooper clad laminate (FCCL) film.

Specifically, the method of manufacturing the tape carrier package according to the present exemplary embodiment of the invention may include: etching and removing a copper clad laminate of the flexible cooper clad laminate (FCCL) film formed in a structure in which the insulating film, an adhesive layer and the copper clad laminate are successively laminated; and producing a base element by forming a lower adhesive layer in a lower part of the insulating layer; forming through holes on the base element; and forming a circuit pattern layer in a lower part of the base element.

Figure 3:
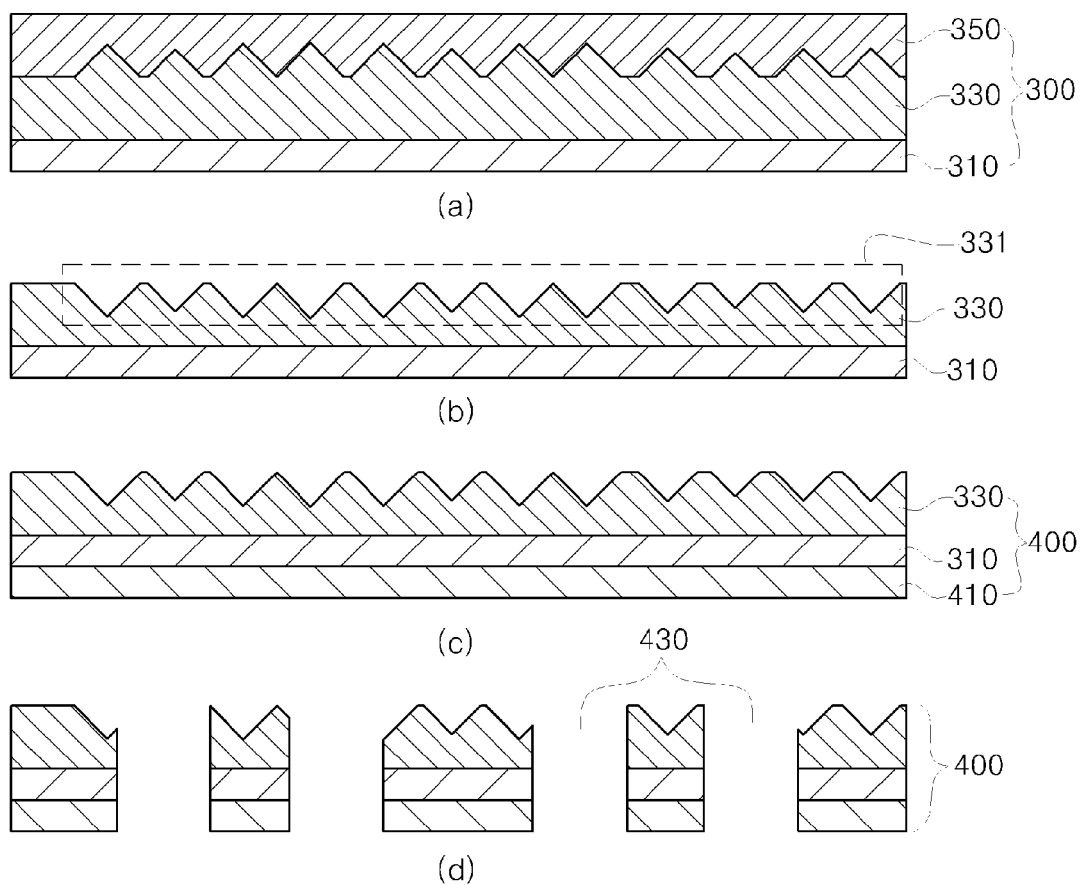
FIG. 3 and FIG. 4 are exemplified views of processes illustrating roughly a method of manufacturing a tape carrier package according to another exemplary embodiment of the present invention.
Figure 4:
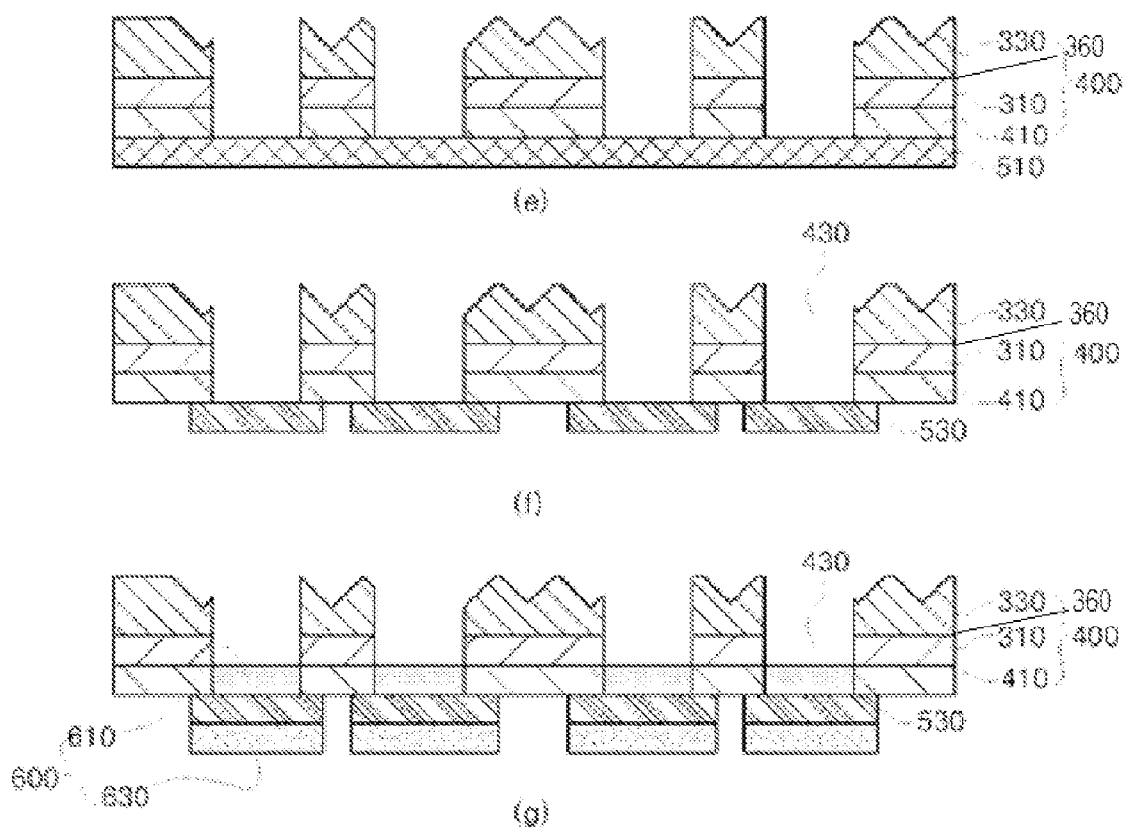

FIG. 3 and FIG. 4 are exemplified views of processes illustrating roughly a method of manufacturing the tape carrier package according to another exemplary embodiment of the present invention.

Referring to FIG. 3 and FIG. 4, as illustrated in (a) on FIG. 3, a flexible copper clad laminate (FCCL) film 300 is prepared, the flexible copper clad laminate being formed in a structure in which an insulating film 310, an adhesive layer 330 and a copper clad laminate 350 are successively laminated, wherein a surface roughness is formed on the adhesive layer.

The flexible copper clad laminate (FCCL) film 300 may be produced by forming the adhesive layer 330 on the insulating film 310 and forming the copper clad laminate 350 by laminating an electrolytic copper foil on the adhesive layer 330. In this case, a roughness formed on a surface of the electrolytic copper foil is reflected to the adhesive layer 330, so a surface roughness is formed on the adhesive layer 330. Here, by adjusting conditions such as a thickness of the electrolytic copper foil, laminating conditions (e.g. a temperature or pressure), a roughness Rz of the surface roughness formed on the adhesive layer 130 may be adjusted.

Then, when the copper clad laminate is removed through an etching process, as illustrated in (b) on FIG. 3, a construction in which the surface roughness 331 is formed on the adhesive layer 330 is obtained. At this time, the roughness Rz of the surface roughness 331 may be formed within a range of 3 to 10 μm to improve adhesion with molding resin and to prevent pollution during manufacturing processes from being generated, but the present invention is not limited to this.

After removing the copper clad laminate, as illustrated in (c) on FIG. 3, a lower adhesive layer 410 is formed in a lower part of the insulating film 310, thereby producing a base element 400. At this time, the lower adhesive layer 410 may be formed by applying an adhesive to the lower part of the insulating film 310, and thereafter performing a laminating process, or bonding a bonding sheet to the lower part of the insulating film 310, and thereafter performing a laminating process.

Then, as illustrated in (d) on FIG. 3, through holes 430 are formed on the base element 400. At this time, a punching process or a laser drill process may be used as a method of forming the through holes 430.

After forming the through holes 430, as illustrated in (e) on FIG. 4, a metal layer 510 is formed in a lower part of the base element 400, more particularly, in the lower part of the insulating film 310. At this time, a method of forming the metal layer 510 may be performed through the laminating process. As a material which forms the metal layer 510, Cu may be used, but the present invention is not limited to this.

Next, a circuit pattern layer 530 as illustrated in (f) on FIG. 4 is formed by patterning the metal layer 510, thereby manufacturing the tape carrier package.

Meanwhile, a plating layer 600 may be further formed on both surface of the circuit pattern layer 530. An electroplating process may be used as a plating process.

Then, molding resin is applied to the insulating film 310 to form a molding part 360, and the adhesive layer 330 having the surface roughness is formed on a surface of the insulating layer 310 to which molding resin is applied. Accordingly, when the molding resin is applied to the insulating layer 310, adhesion between the insulating layer 310 and the molding part 360 is improved due to the surface roughness of the adhesive layer 330. As a result, the tape carrier package having excellent reliability and durability may be manufactured.

Because the tape carrier package according to the present exemplary embodiment of the invention has an improved roughness on the part to which the molding resin is applied compared to the conventional art, it is effective to improve the adhesion between the insulating film and the molding resin due to an increase in surface energy at the time of forming the molding resin on the tape carrier package.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A tape carrier package comprising:
   a base element including an insulating film, a first adhesive layer disposed on the insulating film, and a second adhesive layer disposed beneath the insulating film;
   a circuit pattern layer laminated beneath the second adhesive layer of the base element;
   a through hole group passing through the base element, wherein the through hole group passes from a top surface of the first adhesive layer to a bottom surface of the second adhesive layer;
   a first plating layer disposed on the circuit pattern layer and formed in the through hole group; and
   a second plating layer disposed beneath the circuit pattern layer;
   wherein the through hole group includes a first through hole passing through the first adhesive layer, a second through hole passing through the insulating film, and a third through hole passing through the second adhesive layer;
   wherein a bottom surface of the first plating layer is in direct contact with a top surface of the circuit pattern layer,
   wherein a thickness of the first plating layer equals a thickness of the second adhesive layer,
   wherein a width of the second plating layer equals a width of the circuit pattern layer, and
   wherein the second plating layer has a top surface corresponding to a bottom surface of the circuit pattern layer.

2. The tape carrier package of claim 1, wherein a surface roughness is formed on a top surface of the first adhesive layer.

3. The tape carrier package of claim 1, wherein a top surface of the first plating layer and a top surface of the second adhesive layer are disposed in a same plane, and
   wherein a bottom surface of the first plating layer and a bottom surface of the second adhesive layer are disposed in a same plane.

4. The tape carrier package of claim 2, wherein a roughness (Rz) of the surface roughness is determined in a range of 3 to 10 μm.

* * * * *